(12) United States Patent
Yoon et al.

(10) Patent No.: US 7,433,244 B2
(45) Date of Patent: Oct. 7, 2008

(54) FLASH MEMORY DEVICE AND RELATED ERASE OPERATION

(75) Inventors: Chi-Weon Yoon, Seoul (KR); Heung-Soo Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 11/501,070

(22) Filed: Aug. 9, 2006

(65) Prior Publication Data

US 2007/0147136 A1      Jun. 28, 2007

(30) Foreign Application Priority Data

Dec. 28, 2005      (KR) .................. 10-2005-0131876

(51) Int. Cl.
*G11C 16/00*      (2006.01)
(52) U.S. Cl. .................. 365/185.29; 365/185.11; 365/185.23; 365/185.28
(58) Field of Classification Search ............ 365/185.02
See application file for complete search history.

(56) References Cited

U.S. PATENT DOCUMENTS

| 5,572,466 | A | * | 11/1996 | Sukegawa | 365/185.33 |
|---|---|---|---|---|---|
| 5,687,345 | A | * | 11/1997 | Matsubara et al. | 711/103 |
| 5,982,665 | A | * | 11/1999 | Xing et al. | 365/185.11 |
| 5,986,933 | A | * | 11/1999 | Takeuchi et al. | 365/185.12 |
| 6,272,042 | B1 | * | 8/2001 | Kato et al. | 365/185.11 |
| 6,459,617 | B1 | | 10/2002 | Roohparvar | |
| 6,735,116 | B2 | * | 5/2004 | Lee et al. | 365/185.17 |
| 6,842,378 | B2 | * | 1/2005 | Chang | 365/185.22 |
| 6,856,553 | B2 | | 2/2005 | Tomita et al. | |
| 6,928,002 | B2 | | 8/2005 | Shiga et al. | |
| 7,200,049 | B2 | * | 4/2007 | Park et al. | 365/185.29 |
| 2006/0018158 | A1 | * | 1/2006 | Jo | 365/185.11 |
| 2006/0114725 | A1 | * | 6/2006 | Jeong et al. | 365/185.29 |

FOREIGN PATENT DOCUMENTS

| JP | 2003-257190 | 9/2003 |
|---|---|---|
| JP | 2004-071092 | 3/2004 |
| KR | 1020000021369 | 4/2000 |
| KR | 1020030055152 | 7/2003 |

* cited by examiner

*Primary Examiner*—Tan T. Nguyen
(74) *Attorney, Agent, or Firm*—Volentine & Whitt, PLLC

(57) ABSTRACT

An erase operation for a flash memory device includes identifying a sector group including a plurality of sectors based on an address, simultaneously pre-programming the sectors in the sector group, simultaneously erasing the sectors the sector group, and simultaneously post-programming the sectors in the sector group.

26 Claims, 8 Drawing Sheets

FLASH MEMORY DEVICE AND RELATED ERASE OPERATION

BACKGROUND OF THE INVENTION

1. Field of the Invention

Embodiments of the invention relate to non-volatile memory devices. More particularly, embodiments of the invention relate to flash memory devices and a related erase operation.

This application claims priority under 35 U.S.C § 119 to Korean Patent Application 2005-131876 filed on Dec. 28, 2005, the subject matter of which is hereby incorporated by reference.

2. Discussion of Related Art

Semiconductor memory devices may be categorized as volatile or non-volatile in relation to the nature of their data storage capabilities. In general, volatile memory devices allow high speed read/write operations, but lose stored data when power is interrupted. In contrast, non-volatile memory devices retain stored data even when power is interrupted. As a result, non-volatile memory is typically used for applications requiring the retention of stored data regardless of power state.

Within the broad class of non-volatile memory devices, so-called "flash" electrically erasable programmable read-only memory (EEPROM) devices (hereafter, "flash memory") enjoy several fabrication and performance advantages. For example, flash memory may be easily incorporated at low cost into host devices requiring mass storage capability, because their integration densities are very high relative to conventional EEPROMs. Flash memory is conventionally provided in two primary types—NAND flash memory and NOR flash memory. Each has its own benefits over the other. For example, NOR flash memory provides relatively high speed read/programming operations.

FIG. 1 is a cross-sectional view of a conventional flash memory cell 10. FIG. 2 is a related graph illustrating the distribution of threshold voltages for an ON state and an OFF state of memory cell 10 shown in FIG. 1.

As illustrated in FIG. 1, flash memory cell 10 includes a source region 12 and a drain region 13 formed in a P-type semiconductor substrate 11 (e.g., a bulk semiconductor substrate). A channel region 15 is formed between source region 12 and drain region 13. A thin insulator 14 and a floating gate 16 are disposed over the channel region 15. The thin (first) insulator 14 having a thickness of about 100 angstroms separates a floating gate 16 from channel region 15. A second insulator 17 separates floating gate 16 from an overlaying control gate 18. Control gate 18 is commonly connected with a wordline.

A NOR flash memory cell is programmed by applying a ground voltage (0 volt) to source region 12 and semiconductor substrate 11, a high voltage (about 10 volts) to control gate 18, and an intermediate voltage (5 volts) suitable for generating hot electrons in drain region 13. Under the influence of this programming scheme, negative charge will be accumulated on floating gate 16. As a result, floating gate 16 will develop a negative voltage. This being the case, a corresponding threshold voltage for flash memory cell 10 will rise during a following read operation as the negative charge is dissipated from floating gate 16.

The read operation may be conducted by applying an intermediate voltage (about 5 volts) to control gate 18 and a ground voltage to source region 13. Under the influence of these voltages, channel region 15 of a previously programmed memory cell (i.e., one programmed such that its threshold voltage rises when read) will not become conductive. That is, memory cell 10 is placed in an OFF state and a threshold voltage of the memory cell is distributed to within a range between 7 volts to 9 volts, as illustrated in FIG. 2.

Flash memory cells are typically arranged in groups generally referred to as sectors. The flash memory cells in a given sector may be simultaneously erased by the well known F-N tunneling scheme in which a high negative voltage (about −10 volt) is applied to control gate 18 and a positive voltage (6-9 volts) suitable for generating the F-N tunneling effect is applied to semiconductor substrate 11. Under the influence of these voltages, source region 12 and drain region 13 are maintained in floating state. The resulting bias condition, produces a strong electric field (about 6-7 MV/cm) between control gate 18 and semiconductor substrate 11, thereby generating the F-N tunneling effect. Due to this effect, negative charge accumulates on floating gate 16 as it migrates from source region 12 through thin first insulator 15. Thus, the threshold voltage of flash memory cell 10 drops during the read operation.

Various erasing operations for flash memory devices are disclosed, for examples, in U.S. Pat. Nos. 5,781,477; 5,132,955; 5,220,533; 5,513,193; and 5,805,501, the subject matter of which is hereby incorporated by reference.

Summarizing certain aspects of these convention erase operations, the threshold voltage of an erased flash memory cell is typically distributed within a range of between 1 to 3 volts. However, when memory cells of a sector are simultaneously erased, the threshold voltage of one or more of the individual flash memory cell(s) may drop below 1 volt. In such circumstances, the flash memory cell having a voltage of 1 volt or less is said to be "overerased." The corresponding threshold voltage of an overerased flash memory cell may be corrected through an erase repair operation adapted to shift it back into a target threshold voltage range (e.g., 1-3 volts) corresponding to an ON state for the flash memory cell. Programming operations adapted to correct the threshold voltage of an overerased flash memory cell following an erase operation are referred to as post-programming operations.

FIG. 3 illustrates one example of a conventional erase operation adapted for use with a NOR flash memory device. Characteristic threshold voltage distributions are shown in relation to the constituent steps of the convention erase operation. Thus, the conventional erase operation generally includes a pre-programming operation S20, a main erasing operation S30, and a post-programming operation S40.

Pre-programming operation S20 may be conducted under the same bias conditions described above in relation to the normal programming operation. Pre-programming operation S20 may include a program operation and a program verify operation—both conventionally understood. Until all memory cells in a particular sector selected during pre-programming operation S20 are placed in properly programmed state, the program operation and the program verify operation may be repeated. As a result, the threshold voltages of the programmed memory cells shift to about 7 volts or higher (i.e., a threshold voltage corresponding to an OFF state for the flash memory cell).

Main erasing operation S30 allows all memory cells in the selected sector to be placed in an ON memory cell state. Main erasing operation S30 may include an erase operation and an erase verify operation. The erase operation may be conducted under the same bias condition described above in relation to the programming operation. Until all memory cells in a sector selected during the main erasing operation S30 are placed in an erase state, the erase operation and the erase verify operation may be repeated.

However, the individual memory cells in a selected sector will have different erase speeds. Accordingly, although pre-programming operation S20 has been uniformly applied to all of the memory cells in the sector, there may nonetheless be memory cells overerased by main erasing operation S30. In order to correct the threshold voltage of such overerased memory cells, post-programming operation S40 is performed.

Post-programming operation S40 is performed by grounding substrate 11 and source 12 of an overerased memory cell, connecting control gate 18 of the overerased memory cell to a voltage (e.g., 3 volts) lower than the programming voltage (e.g., 10 volts), and connecting drain 13 of the overerased memory cell to an intermediate voltage (about 5-6 volts). As a result of this voltage bias condition, negative charge is again accumulated on floating gate 16, albeit the quantity of negative charge accumulated is less than that accumulated during the programming operation. Post-programming operation S40 may, thus, be conducted under conditions highly analogous to pre-programming operation S20. As a result of post-programming operation S40, the threshold voltage of an overerased flash memory cell may be shifted to within a target threshold voltage range (e.g., 1-3 volts) corresponding to an ON state for the flash memory cell.

As one may understand from the foregoing summary of conventional erase operations and from a more detailed review of the incorporated references, an erase operation for a NOR flash memory device is a very complex procedure. Memory cells of a conventional NOR flash memory device are erased on a sector by sector basis. For this reason, individual erase operations for respective sectors must be conducted sequentially. Namely, after an erase operation is performed on one sector of memory cells, including all of the steps described in relation to the flowchart of FIG. 3, the erase operation must be separately performed for the next sector of memory cells. Thus, the total time required for a global erase operation in a NOR flash memory device is equal to the multiple of the time required to perform one sector erase operation times the number of sectors being erased. As NOR flash memory devices increase in size, so too does the number of sectors. As the number of sectors increase, the time required to perform a global erase operation also increases.

SUMMARY OF THE INVENTION

In one embodiment, the invention provides an erase operation for a flash memory device, comprising; (a) identifying a sector group including a plurality of sectors in relation to an address, (b) simultaneously pre-programming the sectors in the sector group, (c) simultaneously erasing the sectors the sector group, and (d) simultaneously post-programming the sectors in the sector group.

In another embodiment, the invention provides a flash memory device comprising; a memory cell array including a plurality of banks each having a plurality of sectors, a controller adapted to identify a sector group including a plurality of the sectors in response to a received address, and a plurality of write drivers adapted to simultaneously erase the sectors in the sector group under control of the controller.

DESCRIPTION OF EMBODIMENTS

Figure 1:
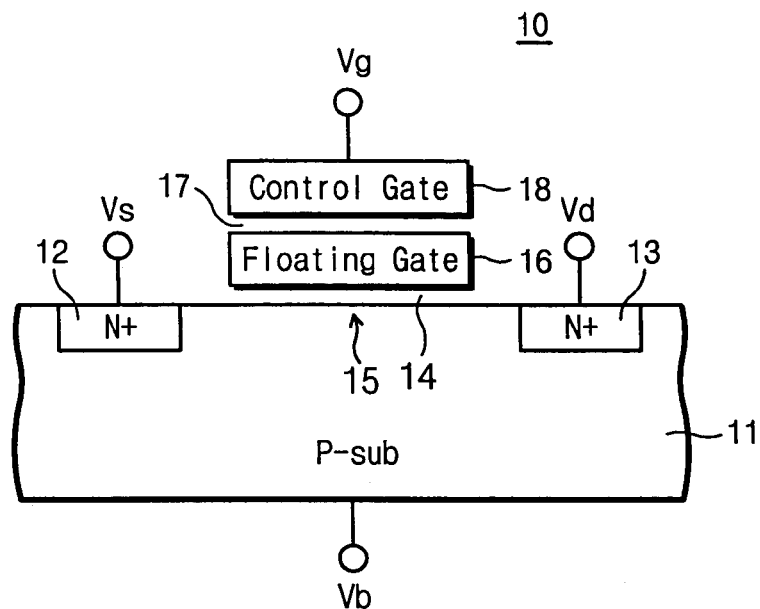
FIG. 1 is a cross-sectional view of a conventional flash memory cell.
Figure 2:
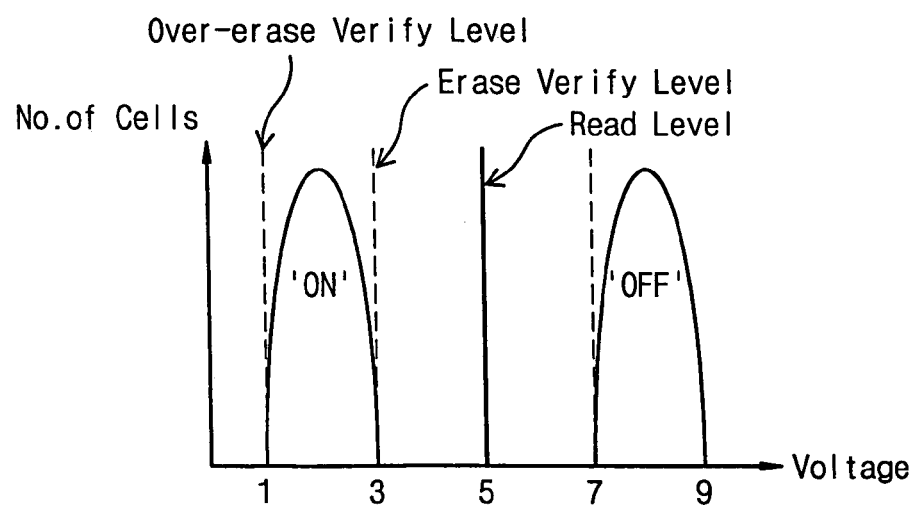
FIG. 2 is a graph illustrating the distribution of threshold voltages of an ON cell and an OFF cell in the conventional flash memory cell of FIG. 1.
Figure 3:
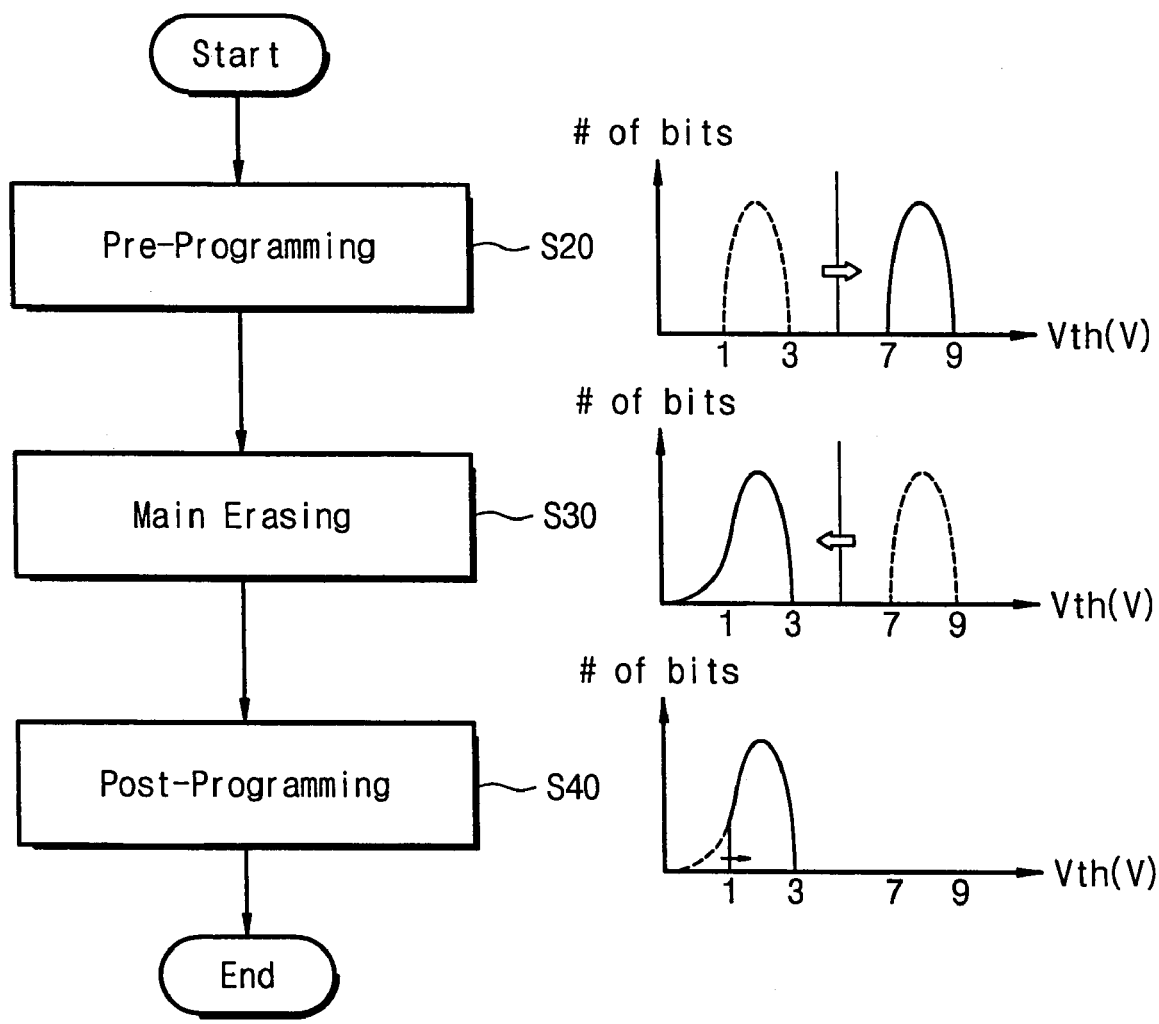
FIG. 3 illustrates an erase operation for a conventional NOR flash memory device and corresponding threshold voltages derived during the erase operation.
Figure 4:
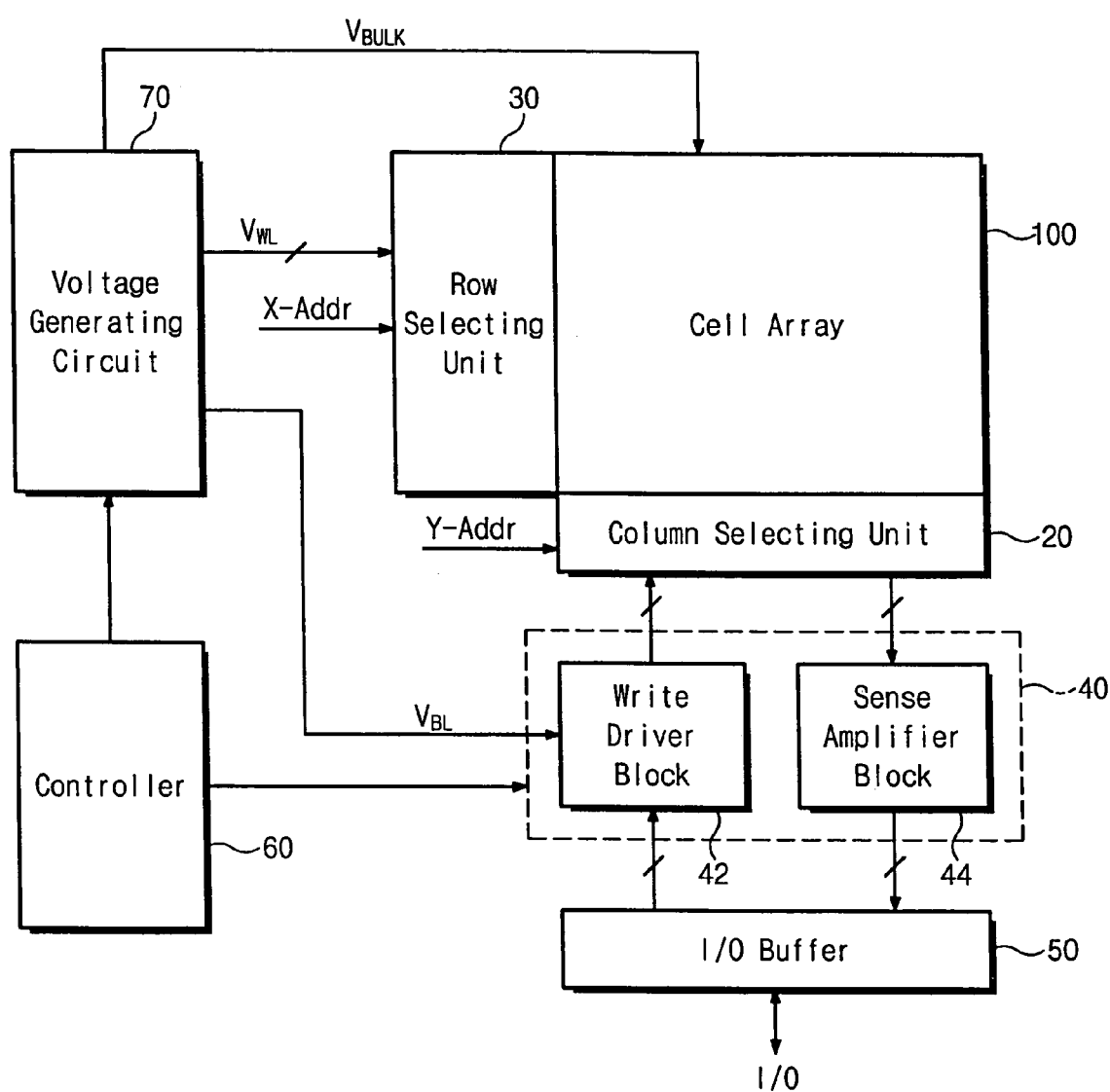
FIG. 4 is a general block diagram of a NOR flash memory device according to one embodiment of the invention.
Figure 5:
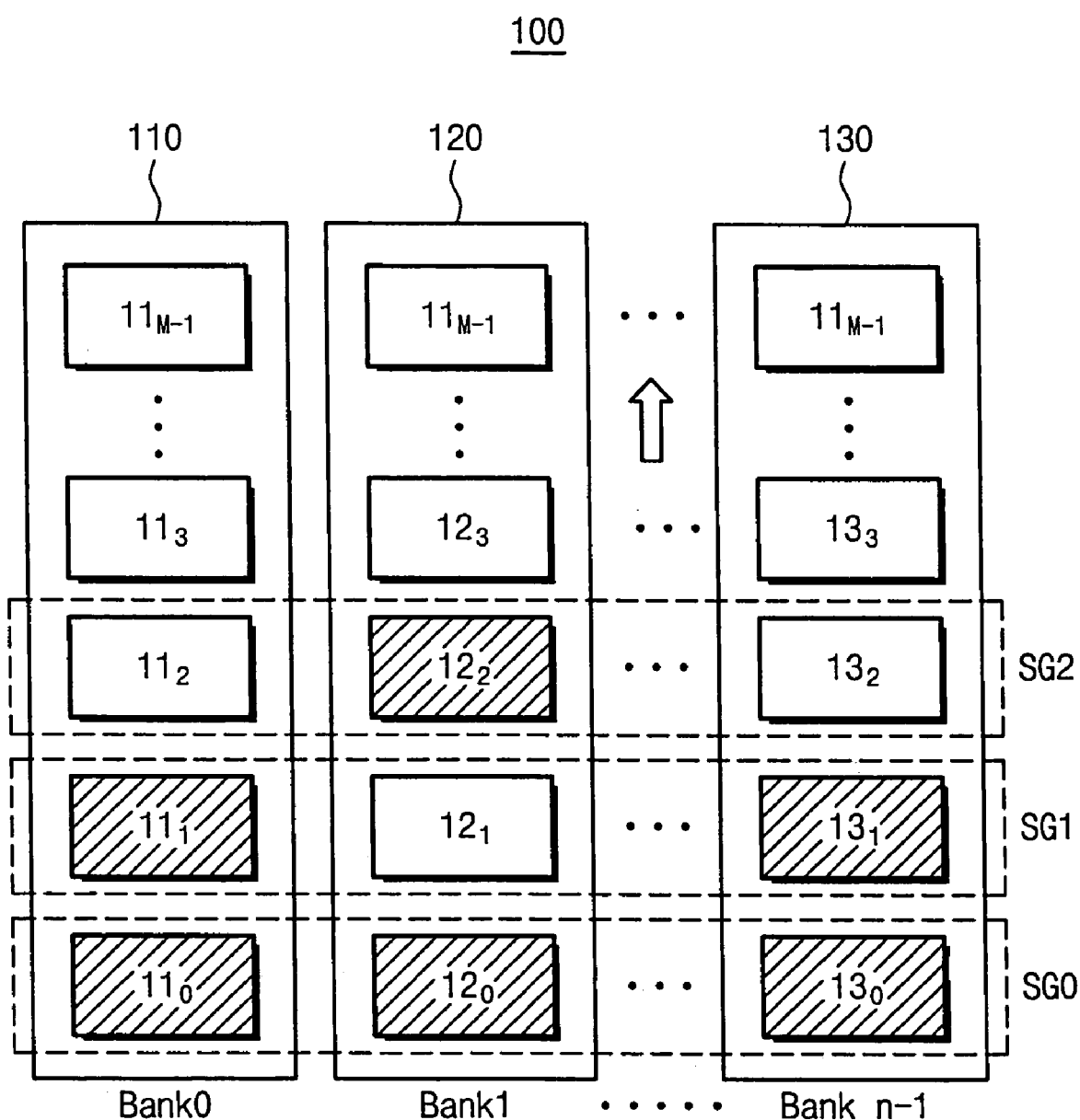
FIG. 5 is an exemplary configuration diagram of the memory cell array shown in FIG. 4.

FIG. 4 is a block diagram of a NOR flash memory device according to an embodiment of the invention, and FIG. 5 is a related configuration diagram further illustrating the memory cell array 100 shown in FIG. 4.

Referring collectively to FIGS. 4 and 5, the flash memory device generally comprises a memory cell array 100, a column selecting unit 20, a row selecting unit 30, an data input/output circuit 40, an input/output buffer (I/O buffer) 50, a controller 60, and a voltage generating circuit 70. Each of these elements denotes a circuit type commonly understood by those of ordinary skill in the art. A detailed description of the conventional design and functional aspects of these elements is omitted for the sake of clarity.

As illustrated in FIG. 5, memory cell array 100 comprises a plurality of banks 110, 120, and 130 each having a plurality of sectors ($11_0$, $11_1$, $11_2$, ...), ($12_0$, $12_1$, $12_2$, ...), and ($13_0$, $13_1$, $13_2$, ...) grouped into erase units (or sector groups (SG)). Each of the sectors includes a plurality of memory cells arranged, as is conventional, at the respective intersections of rows (or wordlines) and columns (or bitlines).

Voltage generating circuit 70 generates the plurality of conventionally understood voltages (e.g., a bulk voltage $V_{BULK}$, a wordline voltage $V_{WL}$, and a bitline voltage $V_{BL}$, etc.) needed to perform the respective programming, erase, and read operations. Row selecting unit 30 selects a wordline in response to a row address X-Addr and applies the wordline voltage $V_{WL}$ generated by voltage generating circuit 70 to the selected wordline.

Column selecting unit 20 selects a plurality of bitlines each corresponding to banks 110, 120, and 130 in response to a column address Y-Addr. I/O buffer 50 stores data to be programmed into memory cell array 100 and data sensed from memory cell array 100.

Data input/output circuit 40 includes a write driver block 42 and a sense amplifier block 44. Write driver block 42 includes a plurality of conventional write drivers (not shown) each corresponding to banks 110, 120, and 130. Sense amplifier block 44 includes a plurality of conventional sense amplifiers (not shown) each corresponding to banks 110, 120, and 130. The write drivers apply program/erase voltages to a plurality of sectors arranged in the different banks. The sense amplifiers sense data from the plurality of the sectors arranged in the different banks. I/O buffer 50 stores data to be programmed to, and data sensed from memory array 100.

Controller 60 controls the general operations conventionally associated with a flash memory device, such as programming, erase, and read operations. As typically implemented, controller 60 independently controls operation of the write drivers and sense amplifiers in order to simultaneously erase a plurality of sectors arranged in different banks. For the purpose of this, controller 60 is adapted and configured to control all aspects of the erase operation, e.g., a row address counter, a bank address counter, and so forth.

As described below in some additional detail, the flash memory device according to the illustrated embodiment of the invention simultaneously performs erase operations over a plurality of sectors arranged in different ones of the plurality of banks. As noted above, sectors thus grouped constitute an individual sector group (SG), as illustrated in FIG. 5. An erase operation is conducted for each sector group. Each sector group SG0, SG1, . . . includes designated sectors ($11_0$, $12_0$, $13_0$), ($11_1$, $12_1$, $13_1$), . . . arranged in a row direction. The number of sectors included in a sector group may be defined in relation to a maximum number of sectors that the NOR flash memory device is capable of simultaneously programming and/or erasing (e.g., four or eight sectors). However, individual sector groups SG0, SG1, SG2, . . . may have different sizes and/or configurations, as dictated by particular design objectives.

Figure 6:
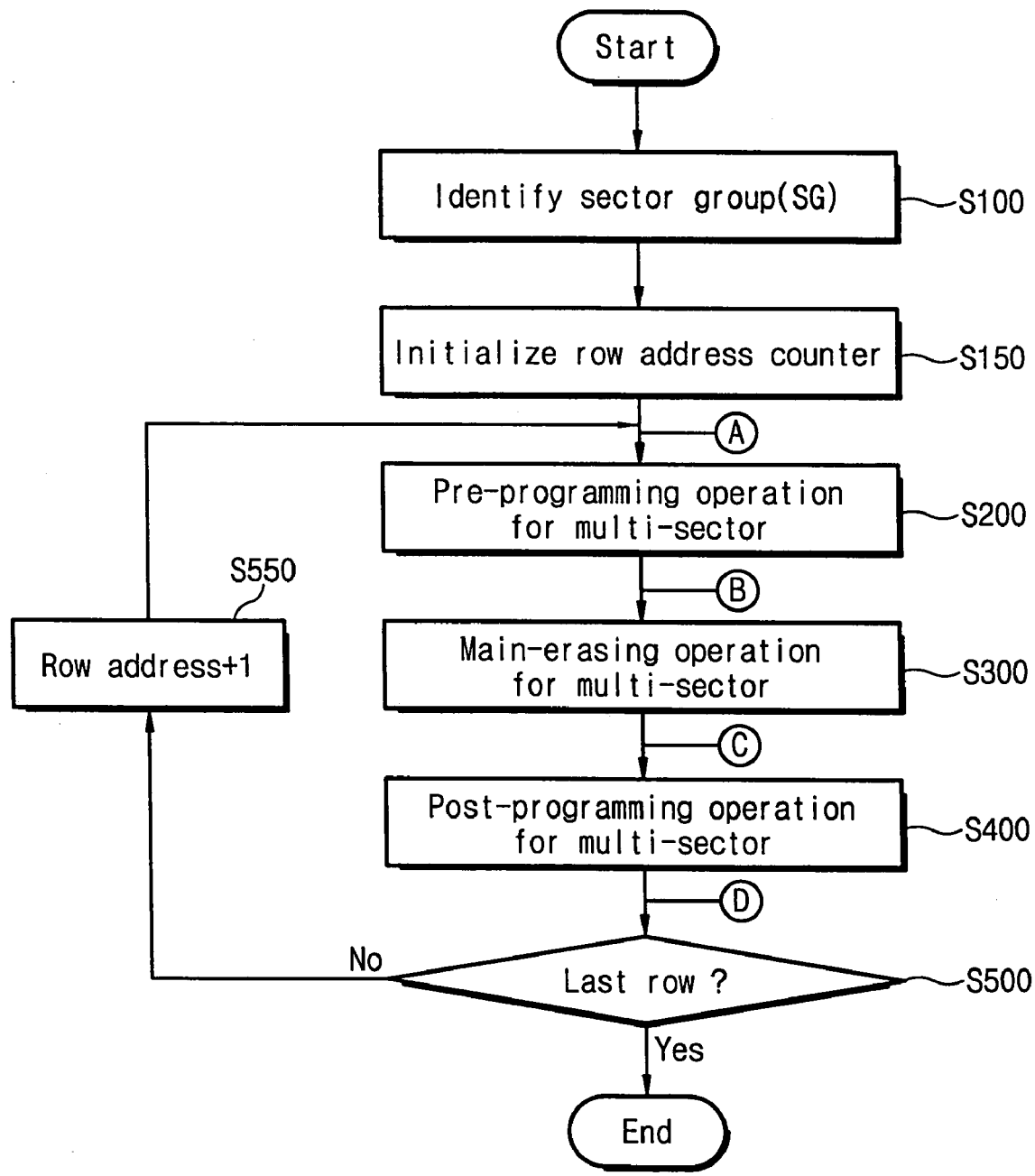
FIG. 6 is a flowchart illustrating an erase operation for a NOR flash memory device according to an embodiment of the invention.

FIG. 6 is a flowchart illustrating an exemplary erase operation for a NOR flash memory device according to an embodiment of the invention. In one specific aspect, the flowchart of FIG. 6 illustrates an operation simultaneously erasing a plurality of sectors arranged in different banks.

Referring collectively to FIGS. 5 and 6, in an erase operation, the flash memory device receives an externally generated erase command indicating an erase operation and a memory cell address to be erased. Based on the received address, a sector group including a plurality of sectors is identified (S100). The identification of the sector group is performed by controller 60, as part of the general control operations associated with the erase operation. Hereinafter, a plurality of sectors included within an identified sector group will be referred to as a "multi-sector." The multi-sector may comprise sectors arranged in different banks and may in one embodiment include sectors having the same row address (X-Addr). The received address and sector information may be stored in any competent data storage location such as, for example, an address buffer.

Controller 60 initializes a row address counter to an initial value (e.g., "0") (S150). The row address counter may be specially or generally provided within controller 60. The value of the row address counter may be used to control a multi-sector erase operation relative to one or more row addresses (i.e., wordline(s)). As described below in some additional detail, a pre-programming operation, an erase operation, and a post-programming operation for a multi-sector may be conducted in relation to an incrementing (or decrementing) value provided by the row address counter.

Once the row address counter is initialized, a pre-programming operation is conducted for each of the sectors to be erased in the identified multi-sector (S200). The pre-programming operation may, however, be simultaneously conducted for multiple sectors selected from the identified sector group. The pre-programming operation may be performed using the same bias condition as that associated with a normal program operation. For example, a ground voltage (0 volt) may be applied to the semiconductor substrate and source region of memory cells in the selected sectors; a high voltage (about 10 volts) may be applied to the control gate of the memory cells; and an intermediate voltage (5 volts) suitable for generating hot electrons may be applied to the drain region of the memory cells. According to this bias condition, negative charge will be sufficiently accumulated on the corresponding floating gate. Therefore, the threshold voltage of the memory cell rises to prevent overerasure of memory cells during an erase operation.

A conventional verify operation may be performed as part of the pre-programming operation S200. Thus, it will be understood by those skilled in the art that the program and program verify operations are repeatedly performed until the threshold voltages of all memory cells included in selected multi-sector rise to a predetermined threshold voltage. The pre-programming operation is conducted by independent operation of the write drivers and sense amplifiers under the control of controller 60. For example, during the pre-programming operation, the program verify operation may be performed by operation of the sense amplifiers.

Figure 7:
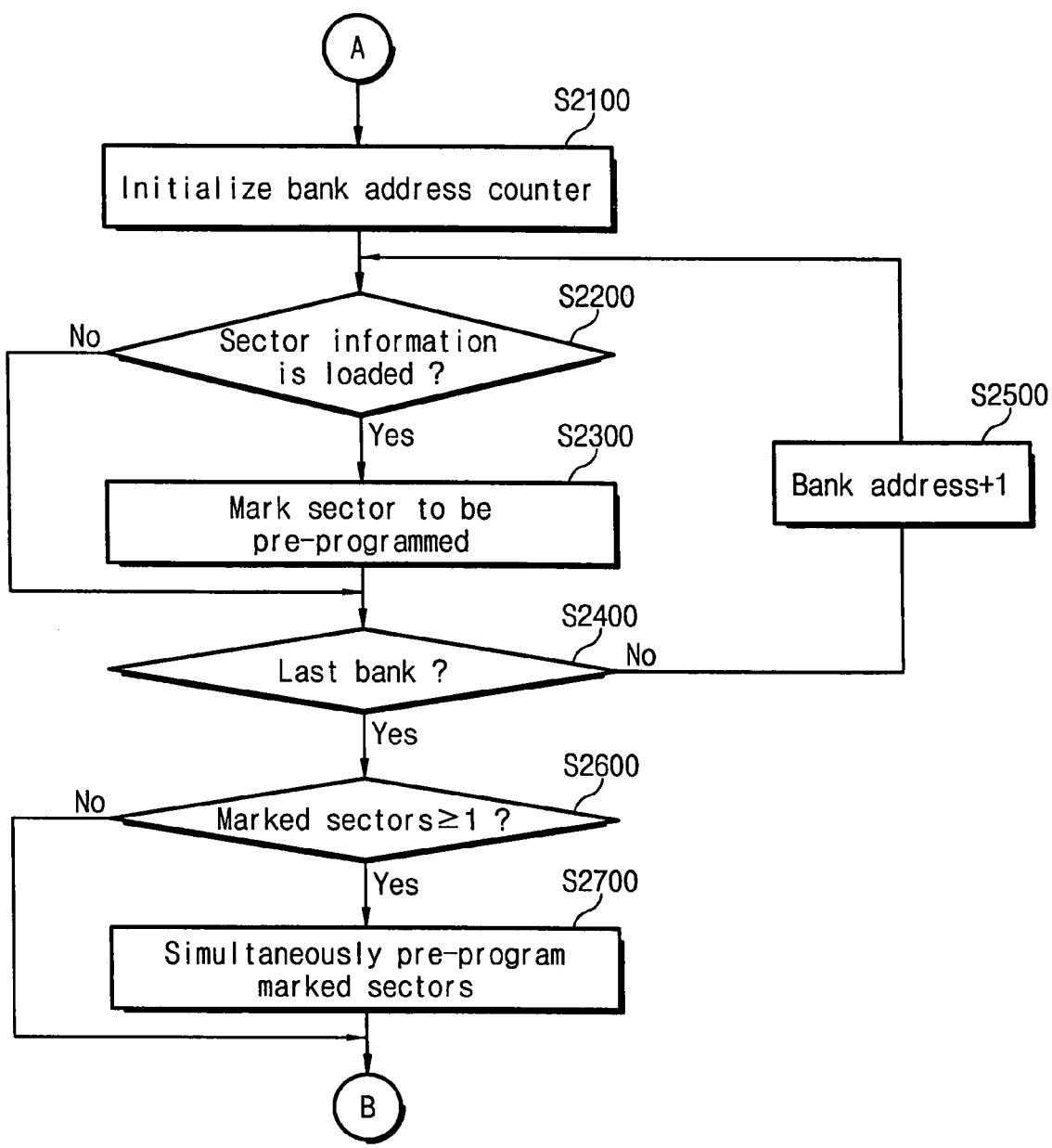
FIG. 7 is a flowchart illustrating an exemplary pre-programming operation for the multi-sector shown in FIG. 6.

FIG. 7 is a flowchart further illustrating the pre-programming operation for a multi-sector shown in FIG. 6. A bank address counter is initialized (S2100). The bank address counter may be provided within controller 60. The value stored in bank address counter may be used to scan sectors to be simultaneously pre-programmed within the sector group identified in S100. For example, scanning may be performed for sectors arranged in each bank. While scanning the sectors, controller 60 determines whether information (e.g., address information) related to a sector included in a selected bank is loaded into an address buffer (S2200). If the information related to the sector is loaded in the address buffer, the sector is marked as a sector to be pre-programmed (S2300). The marking operation may be performed under the control of controller 60. The marking result may be stored in any competent data storage location such as, for example, a register in controller 60.

Controller 60 then determines whether the currently scanned bank is the last bank (S2400). If the currently scanned bank is not the last bank, a bank address incremented by 1 (S2500) and the routine returns to S2200. However, if the currently scanned bank is the last bank, the scanning operation is ended.

Next, controller 60 determines whether there are one or more sectors marked as requiring pre-programming (S2600). If there are one or more marked sectors, they are pre-programmed simultaneously (S2700). If not, the pre-programming operation for a corresponding sector group is omitted.

Returning to FIG. 6, following the pre-programming operation for a multi-sector, a main erasing operation for the multi-sector is performed (S300). That is to say, the main erasing operation is conducted for sectors selected from the same sector group. Each memory cell in the selected sectors are simultaneously erased using a F-N tunneling scheme in which a high negative voltage (about −10 volts) is applied to the control gate of the memory cell and a positive voltage (about 6-9 volts) suitable for generating F-N tunneling is applied to a semiconductor substrate. A source region and a drain region of the memory cell are maintained at a floating state. According to this bias condition, negative charge accumulates on the corresponding floating gates and drops the threshold voltage of the memory cell. The main erasing operation is repeatedly performed until all memory cells included in selected memory multi-sectors are placed in an erase state (i.e., ON cell state). The main erasing operation may be conducted for each bank by independent operation of the write drivers and sense amplifiers under the control of controller 60.

Figure 8:
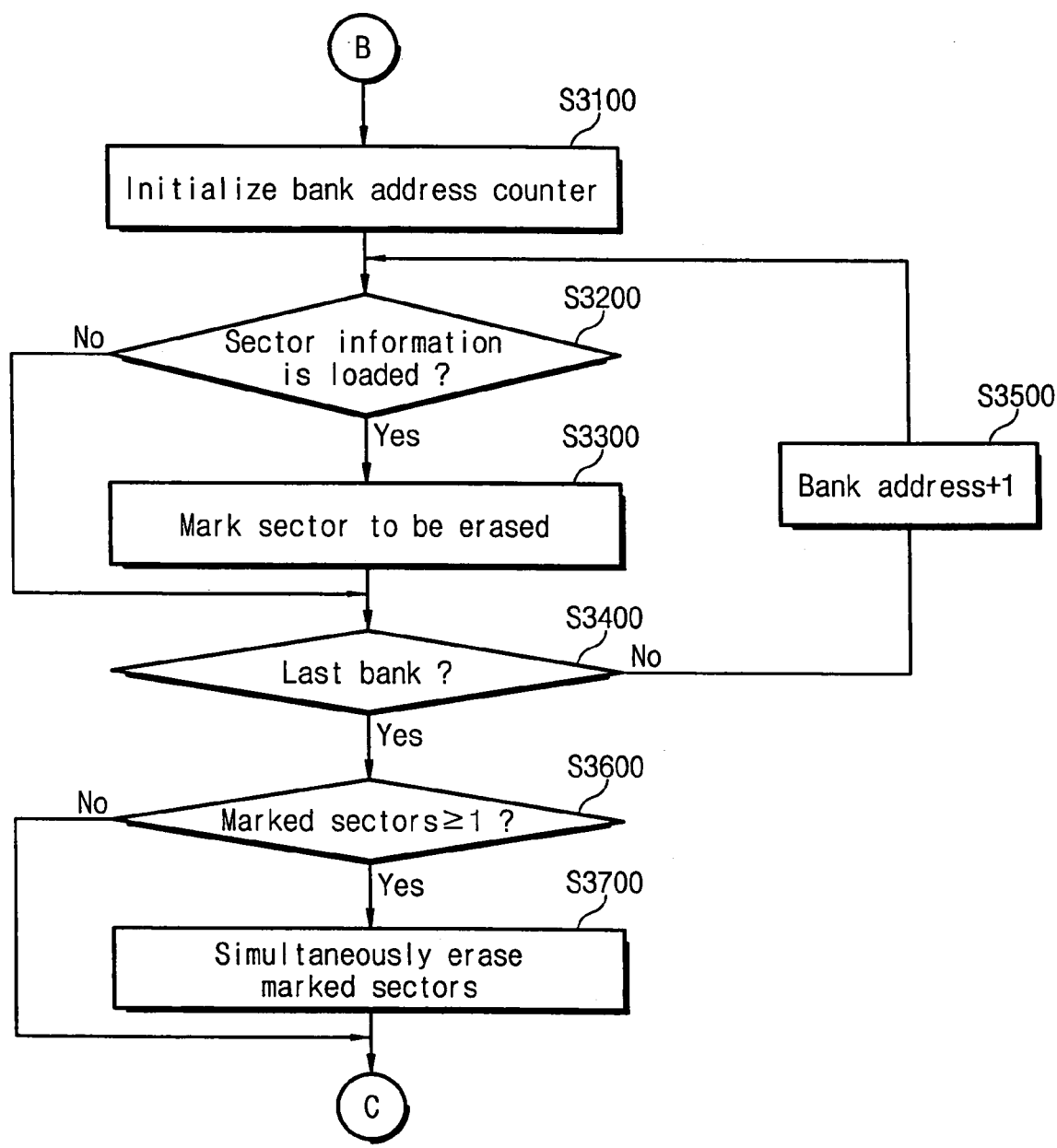
FIG. 8 is a flowchart illustrating an exemplary main erasing operation for the multi-sector shown in FIG. 6.

FIG. 8 is a flowchart further illustrating the main erasing operation S300 for the multi-sector shown in FIG. 6. A bank address counter is initialized (S3100). It is then determined whether information (e.g., address information) associated with a sector corresponding to a currently selected bank is loaded into an address buffer as a sector to be erased (S3200). If information for the corresponding sector is loaded as a sector to be erased, the sector is marked as a sector to be erased (S3300). In S3300, the marking operation may be conducted by controller 60. The marking result may be stored in any competent data storage location such as, for example, a register in controller 60.

It is then determined whether the currently scanned bank is the last bank (S3400). If the currently scanned bank is not the last bank, the stored bank address increases by 1 (S3500) and the routine returns to S3200. However, if the currently scanned bank is the last bank, the scanning operation is ended.

It is next determined whether there is one or more sectors marked as a sector to be erased (S3600). If there is one or more marked sectors, they are simultaneously erased (S3700). If there is no marked sector, an erase operation for a corresponding sector group is omitted.

As illustrated in exemplary methods described in relation to FIGS. 7 and 8, the pre-programming/main erasing operations for multi-sectors include simultaneously scanning sectors to be pre-programmed/main-erased and thereafter performing the pre-programming and/or main-erasing operations based on the scanning result. The pre-programming and main erasing operations for the multi-sectors are thus similar in nature, however, potentially differing in their respective bias conditions.

Returning to FIG. 6, following the main erasing operation for multi-sectors S300, a post-programming operation is conducted S400. In S400, the post-programming operation is also simultaneously conducted for selected sectors among sectors included in the same sector group. The post-programming operation shifts threshold voltages for overerased memory cells to within a target threshold voltage range (e.g., 1-3 volts) corresponding to an ON state. The post-programming operation may be conducted for each bank by independent operation of the write drivers and sense amplifiers under the control of controller 60.

Figure 9:
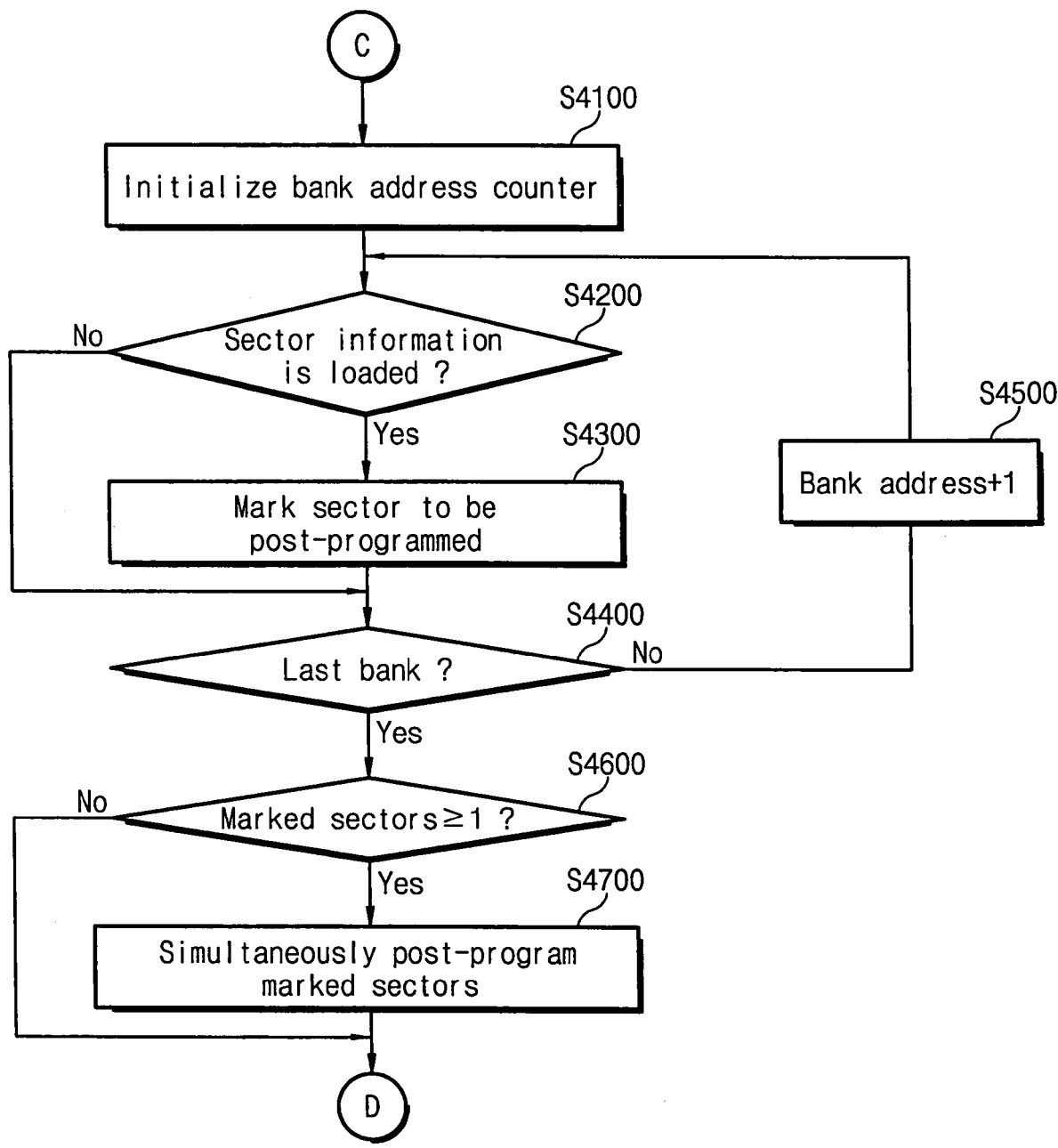
FIG. 9 is a flowchart illustrating an exemplary post-programming operation for the multi-sector shown in FIG. 6.

FIG. 9 is a flowchart further illustrating the post-programming operation S400 for the multi-sector shown in FIG. 6.

Referring collectively to FIG. 7 and FIG. 9, the post-programming operation is substantially similar to the pre-programming operation, except that an operation to be conducted is a post-programming operation instead of a pre-programming operation (i.e., bias conditions will vary). Accordingly, the sequence from S4100 to S4700, including the loop-back incrementing of the bank address S4500 of FIG. 9 is analogous to the sequence from S3100 to S3700 in FIG. 8 and will not be further described.

Returning to FIG. 6, if the post-programming operation is conducted, it is determined whether a currently selected row is the last row to be erased (S500). The determination may be done by checking whether a value of a row address counter has reached a maximum set value of a row address. If the currently selected row is not the last row, the row address increments by 1 (S550) and the routine returns to S200. If the currently selected row is the last row, the routine is ended.

According to the above-described erase method, a plurality of sectors included in different banks (i.e., multi-sectors) and identified as a sector group may be erased simultaneously. Among each multi-sector group, the number of sectors to be erased may be varied, but an exemplary configuration of sector groups SG0, SG1, SG2, . . . , is illustrated in FIG. 5. Further, sizes of the sector groups may be different during respective erase operations. For example, if a flash memory device is capable of simultaneously programming four sectors and erasing eight sectors, a sector group subjected to a pre-programming operation and a post-programming operation may comprise four sectors and a sector group subjected to a main erasing operation may comprise of eight sectors. Namely, the number of sectors to be simultaneously programmed during the pre-programming operation and the post-programming operation and the number of sectors to be simultaneously erased during the main erasing operation will vary with particular flash memory circuit configurations.

As explained so far, a plurality of sectors may be simultaneously erased to shorten the global erase time for a flash memory device. As one result of an embodiment of the invention, the erase time may be reduced down to 1/N (where N is the number of sectors) the conventional global erase time in accordance with the particular patterns of sectors defined within the flash memory device to be erased, or the number of programmable/erasable sectors.

Although the present invention has been described in connection with certain embodiments illustrated in the accompanying drawings, it is not limited to only these embodiments. It will be apparent to those skilled in the art that various substitution, modifications and changes may be thereto without departing from the scope of the invention as defined by the following claims.

What is claimed is:

1. An erase operation for a flash memory device, comprising a memory cell array arranged in a plurality of banks, the erase operation comprising:
   (a) identifying a sector group including a plurality of sectors in relation to a received row address, wherein the sectors in the sector group are respectively arranged across the plurality of banks followed by:
   (b) simultaneously pre-programming the sectors in the sector group;
   (c) simultaneously erasing the sectors the sector group; and
   (d) simultaneously post-programming the sectors in the sector group.

2. The erase operation of claim 1, further comprising:
   following (a), repeating (b), (c), and (d) until all sectors in the sector group are erased.

3. The erase operation of claim 1, wherein the number of sectors in the sector group is determined by the number of sectors that may be simultaneously programmed in the flash memory device or the number of sectors that may be simultaneously erased in the flash memory device.

4. The erase operation of claim 1, wherein (b) comprises:
   (b1) marking sectors in the sector group to be pre-programmed in response to the address; and
   (b2) simultaneously pre-programming the marked sectors.

5. The erase operation of claim 4, further comprising:
   omitting (b) when no sector is marked.

6. The erase operation of claim 1, wherein (c) comprises:
   (c1) marking sectors in the sector group to be erased; and
   (c2) simultaneously erasing the marked sectors.

7. The erase operation of claim 6, further comprising:
   omitting (c) when no sector is marked.

8. The erase operation of claim 1, wherein (d) comprises:
   (d1) marking sectors in the sector group to be post-programmed among the sectors in the sector group; and
   (d2) simultaneously post-programming the marked sectors.

9. The erase operation of claim 8, further comprising:
   omitting (d) when no sector is marked.

10. A flash memory device comprising:
    a memory cell array including a plurality of banks, each bank in the plurality of banks having a plurality of sectors;

a controller adapted to identify a sector group including a plurality of the sectors in response to a received address; and a plurality of write drivers adapted to simultaneously erase the sector group under control of the controller, wherein pre-programming, main-erasing, and post-programming operations are performed simultaneously with respect to the sectors in the sector group, and in response to the received address, the controller is further configured to perform marking sectors in the sector group to be pre-programmed, marking sectors in the sector group to be main-erased, and marking sectors in the sector group to be post-programmed.

11. The flash memory device of claim 10, wherein the pre-programming, main-erasing, and post-programming operations are repeatedly performed until all sectors in the sector group are erased.

12. The flash memory device of claim 10, further comprising:

a plurality of sense amplifiers adapted to sense results of the pre-programming, main-erasing, and post-programming operations for sectors in the sector group under control of the controller.

13. The flash memory device of claim 10, wherein respective sectors in the sector group are arranged in different ones of the plurality of banks.

14. The flash memory device of claim 10, wherein the sectors in the sector group have the same row address.

15. The flash memory device of claim 10, wherein the number of sectors in the sector group is determined in relation to the maximum number of sectors that may be simultaneously programmed within the flash memory device or the maximum number of sectors that may be simultaneously erased in the flash memory device.

16. The flash memory device of claim 10, wherein the controller marks sectors in the sector group to be pre-programmed, and the marked sectors are simultaneously pre-programmed.

17. The flash memory device of claim 10, wherein the pre-programming operation is omitted when no sectors are marked in the sector group.

18. The flash memory device of claim 10, wherein the controller marks sectors in the sector group to be main-erased and the marked sectors are simultaneously erased.

19. The flash memory device of claim 10, wherein the main-erasing operation is omitted when no sectors are marked in the sector group.

20. The flash memory device as recited 10, wherein the controller marks sectors in the sector group to be post-programmed and the marked sectors are simultaneously post-programmed.

21. The flash memory device of claim 10, wherein the post-programming operation is omitted when no sectors are marked in the sector group.

22. The method of claim 10, wherein the flash memory device is a NOR flash memory device.

23. A method of erasing memory cells in a flash memory device, the flash memory comprising a memory array arranged in a plurality of banks, and the method of erasing comprising:

identifying a sector group including a plurality of sectors in relation to a received address, wherein the sectors in the sector group are respectively arranged across the plurality of banks; followed by:

sequentially performing pre-programming, main-erasing, and post-programming operations for the sectors in the sector group, wherein each one of the pre-programming, main-erasing, and post-programming operations is conducted simultaneously with respect to the sectors in the sector group; and performing in response to the received address at least one of; marking sectors in the sector group to be pre-programmed, marking sectors in the sector group to be main-erased, and marking sectors in the sector group to be post-programmed.

24. The method of claim 23, further comprising:

repeating the pre-programming, main-erasing, and post-programming operations for the sectors in the sector group until all sectors in the sector group are erased.

25. The method of claim 23, wherein the received address comprises at least one row address.

26. The method of claim 23, wherein the flash memory device is a NOR flash memory device.

* * * * *